United States Patent
Yamamoto

(10) Patent No.: US 7,439,181 B2
(45) Date of Patent: Oct. 21, 2008

(54) METHOD FOR PROCESSING INTERIOR OF VAPOR PHASE DEPOSITION APPARATUS, METHOD FOR DEPOSITING THIN FILM AND METHOD FOR MANUFACTURING SEMICONDUCTOR DEVICE

(75) Inventor: Tomoe Yamamoto, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/842,462

(22) Filed: Aug. 21, 2007

(65) Prior Publication Data

US 2007/0289610 A1    Dec. 20, 2007

Related U.S. Application Data

(63) Continuation of application No. 11/141,019, filed on Jun. 1, 2005, now Pat. No. 7,276,444.

(30) Foreign Application Priority Data

Jun. 2, 2004    (JP) .............................. 2004-164126

(51) Int. Cl.
    H01L 21/44    (2006.01)
(52) U.S. Cl. ...................................... 438/681
(58) Field of Classification Search ............... 438/681, 438/680, 785, 905; 257/E21.006; 118/723 IR
    See application file for complete search history.

(56) References Cited

U.S. PATENT DOCUMENTS

| 5,679,215 | A | * | 10/1997 | Barnes et al. ................. 134/1.1 |
| 5,705,225 | A | | 1/1998 | Dornfest et al. |
| 6,147,006 | A | * | 11/2000 | Mouri et al. ................. 438/706 |
| 6,554,910 | B1 | | 4/2003 | Sandhu et al. |

FOREIGN PATENT DOCUMENTS

| JP | 2000-277459 A | 10/2000 |
| JP | 2002-134488 A | 5/2002 |

* cited by examiner

Primary Examiner—Caridad M Everhart
(74) Attorney, Agent, or Firm—Sughrue Mion, PLLC

(57) ABSTRACT

A method for depositing a metal compound film on the wafer by using a vapor phase deposition apparatus 100, including: forming a thin film on the wafer in an interior of the vapor phase deposition apparatus 100 by introducing a source gas for the metal compound film containing Hf or Zr; unloading the wafer having the metal compound film formed thereon from the interior of the vapor phase deposition apparatus 100; introducing a reactive gas in the interior of the vapor phase deposition apparatus 100 to immobilize the unreacted organic compound 180 derived from the source gas remained in the interior of the vapor phase deposition apparatus 100; loading another wafer in the interior of the vapor phase deposition apparatus 100; and depositing metal compound film on another wafer by further introducing the source gas in the interior of the vapor phase deposition apparatus 100, in the condition that the unreacted organic compound 180 exists therein as an immobilized form, is presented.

11 Claims, 9 Drawing Sheets

METHOD FOR PROCESSING INTERIOR OF VAPOR PHASE DEPOSITION APPARATUS, METHOD FOR DEPOSITING THIN FILM AND METHOD FOR MANUFACTURING SEMICONDUCTOR DEVICE

This application is based on Japanese patent application NO. 2004-164126, the content of which is incorporated hereinto by reference.

BACKGROUND OF THE INVENTION

1. Field of the Invention

The present invention relates to a method for processing an interior of a vapor phase deposition apparatus, a method for depositing a thin film and a method for manufacturing a semiconductor device.

2. Related Art

In recent years, various innovations on techniques for inhibiting a generation of particles in a metal compound film are actively made for the purpose of providing a stable formation of a metal compound film having improved quality by employing a vapor phase deposition apparatus. Typical example of such techniques includes a technique disclosed in Japanese Patent Laid-Open No. 2000-277,459. Japanese Patent Laid-Open No. 2000-277,459 describes a technique for nitriding a Ti film disposed on a chamber interior wall or a shower head during a deposition process by containing $NH_3$ gas and $H_2$ gas in a deposition gas for depositing a metal compound film including Ti, and further removing chlorine from the formed titanium nitride to provide a film that has better resistance to be flaked off from the chamber interior wall.

Another typical example of such techniques includes a technique disclosed in Japanese Patent Laid-Open No. 2002-134,488. Japanese Patent Laid-Open No. 2002-134,488 describes a technique for fluorinating an $SiO_2$ film deposited on a chamber interior wall with radical to remove thereof, by separately introducing fluorine radical ion in every time after the multiple deposition process steps are carried out.

SUMMARY OF THE INVENTION

However, it has now been discovered that the conventional techniques disclosed in the above-described literatures still contain a room for an improvement in the following points.

Firstly, the technique described in Japanese Patent Laid-Open No. 2000-277,459 involves, in the first place, nitriding the Ti film on the chamber interior wall or on the shower head during the deposition process, and thus it is difficult to employ the technique without any modification to a cleaning process that conducts a cleaning process after unloading the wafer from the interior of the vapor phase deposition apparatus.

Further, since the nitriding reaction is a chemical reaction that is not very reactive, there is a problem of providing lower efficiency for the nitridation of the Ti film on the chamber interior wall or shower head. In addition, since the nitridation is conducted during the deposition process, the deposition of the Ti film onto the chamber interior wall and the immobilization of the Ti film by the nitridation are not compatible, and thus it is difficult to provide a sufficient prevention for the Ti film being flaked off.

Secondly, in the technique described in Japanese Patent Laid-Open No. 2002-134,488, concerning an unreacted compound that produces a fluorinated compound having relatively lower vapor pressure by a fluorinating reaction therewith, such type of unreacted compound is chemically reacted to form a chemical compound having relatively lower vapor pressure even if fluorine radical ion is introduced therein, and therefore it is difficult to remove such chemical compound by vaporizing thereof.

According to the present invention, there is provided a method for processing an interior of a vapor phase deposition apparatus, after conducting a deposition of a thin film by utilizing an organic source material within the vapor phase deposition apparatus, comprising: immobilizing an unreacted organic compound within the interior of the vapor phase deposition apparatus, the unreacted organic compound being derived from the organic source material remained in the interior of the vapor phase deposition apparatus by introducing a reactive gas into the interior of the vapor phase deposition apparatus.

Since the unreacted organic compound derived from the source gas is immobilized by the reactive gas according to the present invention, adhesion of the particles of the unreacted organic compound flaked off from the chamber interior walls or the like onto the thin film is prevented when the deposition process for the thin film within the interior of the vapor phase deposition apparatus is conducted, thereby forming the thin film having improved quality stably with higher production efficiency.

According to the present invention, there is provided a method for forming a thin film by employing a vapor phase deposition apparatus, comprising: processing an interior of a vapor phase deposition apparatus by employing the method for processing the interior of the vapor phase deposition apparatus according to the present invention; and forming a thin film within the interior of the vapor phase deposition apparatus after processing the interior of the vapor phase deposition apparatus.

Since the thin film is formed by introducing the source gas into the interior of the vapor phase deposition apparatus, in which the unreacted organic compound derived from the source gas has been immobilized by the reactive gas according to the present invention, adhesion of the particles of the unreacted organic compound flaked off from the chamber interior walls or the like onto the thin film is prevented, thereby forming the thin film having improved quality stably with higher production efficiency.

According to the present invention, there is provided a method for manufacturing a semiconductor device by employing a vapor phase deposition apparatus, comprising: forming a thin film on a semiconductor substrate within an interior of the vapor phase deposition apparatus; unloading the semiconductor substrate having the thin film formed on the semiconductor substrate from the interior of the vapor phase deposition apparatus after forming the thin film on the semiconductor substrate; processing the interior of the vapor phase deposition apparatus by employing the method for processing the vapor phase deposition apparatus according to the present invention, after unloading the semiconductor substrate; and forming a thin film on another semiconductor substrate, after processing the interior of the vapor phase deposition apparatus and loading the another semiconductor substrate in the interior of the vapor phase deposition apparatus.

Since the adhesion of the particles of the unreacted organic compound flaked off from the chamber interior walls or the like onto the thin film is prevented in the interior of the vapor phase deposition apparatus to provide a stable formation of the thin film having improved quality with higher production efficiency, the semiconductor device comprising the thin film having improved quality can be stably manufactured with higher production efficiency.

While the aspects of present invention have been described as above, it is to be understood that any combination of such aspects is also included in the scope of the present invention. In addition, any conversion of the expressions included in the present invention into another category is also duly included in the scope of the present invention.

For example, while a chemical vapor deposition (CVD) apparatus may be preferably employed for the vapor phase deposition apparatus described above, it is not intended to particularly limit thereto. An atomic layer deposition (ALD) apparatus or the like may also be employed in stead of the CVD apparatus.

It is not necessarily limited to exclusively use the organic source material described above as the source material for the thin film, and other source materials are also employed in conjunction with the organic source material. For example, oxidizing source materials and containing oxygen or a chemical compound containing oxygen may be preferably employed as other source materials. As such, two types of source materials may be alternately employed to deposit the thin film using a CVD technique or an ALD technique, thereby providing the formation of the thin film having improved quality.

In addition, the method for processing the interior of the vapor phase deposition apparatus may further comprise: removing an immobilized material from the interior of the vapor phase deposition apparatus after immobilizing the unreacted organic compound, the immobilized material being formed by immobilizing the unreacted organic compound.

According to such method, since the immobilized material is removed from the interior of the vapor phase deposition apparatus, the adhesion of the particles of the unreacted organic compound flaked off from the chamber interior walls or the like onto the thin film is more effectively prevented within the interior of the vapor phase deposition apparatus.

In addition, in the method for processing the interior of the vapor phase deposition apparatus, the process for immobilizing the unreacted organic compound may include introducing an oxidizing gas as the reactive gas.

According to such method, since the unreacted organic compound is oxidized with the oxidizing gas to be effectively immobilized, an improved resistance for the particles derived from the unreacted organic compound to be flaked off from the chamber interior wall or the like is provided. As a result, the adhesion of the particles of the unreacted organic compound flaked off from the chamber interior walls or the like onto the thin film is prevented.

In addition, in the method for processing the interior of the vapor phase deposition apparatus, the process for immobilizing the unreacted organic compound may further include additionally introducing a nitriding gas as the reactive gas.

According to such method, since the unreacted organic compound is nitrided with the nitriding gas to be effectively immobilized, the effect of the nitridation synergically acts with the immobilization with the oxidation, and thus further improved resistance over the particles derived from the unreacted organic compound being flaked off from the chamber interior wall is provided. As a result, the adhesion of the particles of the unreacted organic compound flaked off from the chamber interior walls or the like onto the thin film is further prevented.

In addition, in the method for processing the interior of the vapor phase deposition apparatus, the process for introducing the oxidizing gas may include introducing $O_3$ gas as the oxidizing gas.

According to such method, since the unreacted organic compound is oxidized with $O_3$ gas to be more effectively immobilized, due to better oxidizing property of $O_3$ gas, a further improved resistance over the particles derived from the unreacted organic compound being flaked off from the chamber interior wall or the like is provided. As a result, the adhesion of the particles of the unreacted organic compound flaked off from the chamber interior walls or the like onto the thin film is prevented.

In addition, the organic source material may contain one or more element(s) selected from a group consisting of Hf, Zr, La, Pr, Pb, Sr, Ti and Bi.

Even in the case that the deposition of the thin film is conducted in the vapor phase deposition apparatus by using such organic source materials having lower vapor pressure, the unreacted organic compounds may be immobilized by conducting the above-described process after unloading the wafer. Thus, when another wafer is loaded in the interior of the vapor phase deposition apparatus thereafter and a deposition of a thin film on the another wafer is conducted, the adhesion of the particles of the unreacted organic compound flaked off from the chamber interior walls or the like onto the thin film is prevented.

In addition, in the method for manufacturing the semiconductor device, the process for processing the interior of the vapor phase deposition apparatus may be carried out in every time after a plurality of implementations of the forming the thin film on the semiconductor substrate and the forming the thin film on another semiconductor substrate are conducted.

According to such method, since the immobilizing the unreacted organic compound derived from the source material gas is carried out in every time after a plurality of implementations of the forming the thin film on the semiconductor substrate and the forming the thin film on the another semiconductor substrate are conducted, the process for immobilizing the unreacted organic compound derived from the source gas can be carried out in the interval between the lot processes for wafers or in every time after the deposition process for a wafer.

Thus, even if the lot processes for the wafers or the depositions for the wafers are further carried out after immobilizing the unreacted organic compound derived from the source gas, the adhesion of the particles of the unreacted organic compound flaked off from the chamber interior walls or the like onto the thin film is prevented. In addition, since the process for immobilizing the unreacted organic compound derived from the source gas is all at once conducted in every time after a plurality of implementations of the formation of the thin film are conducted, the throughput per unit time can be increased. Thus, the thin film having higher quality can be stably formed with higher productive efficiency, according to such process.

In addition, the method for manufacturing the semiconductor device may further comprise removing the immobilized material from the interior of the vapor phase deposition apparatus, the immobilized material being formed by immobilizing the unreacted organic compound.

According to such method, since the immobilized material may be removed from the interior of the vapor phase deposition apparatus, the adhesion of the particles of the unreacted organic compound flaked off from the chamber interior walls or the like onto the thin film is more effectively prevented within the interior of the vapor phase deposition apparatus.

In addition, in the method for manufacturing the semiconductor device, the process for removing the immobilized material may be carried out in every time after a plurality of implementations of the immobilizing the unreacted organic compound are carried out.

According to such process, since the immobilized material is all at once flaked off in every time after a plurality of implementations of the immobilizing the unreacted organic compound are carried out, the throughput per unit time can be increased. Thus, the production efficiency for the thin film is stably improved.

According to the present invention, since the unreacted organic compound derived from the source gas remained in the interior of the vapor phase deposition apparatus is immobilized by using the reactive gas, the thin film having higher quality can be stably formed with higher productive efficiency.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments according to the present invention will be described as follows in further detail, in reference to the annexed figures. In all figures, identical numeral is assigned to an element commonly appeared in the figures, and the detailed description thereof will not be presented.

A method for processing an interior of a vapor phase deposition apparatus 100, after conducting a deposition of a thin film (metal compound film 104) by utilizing an organic source material within the vapor phase deposition apparatus 100, comprises immobilizing an unreacted organic compound 180 within the interior of the vapor phase deposition apparatus 100, the unreacted organic compound 180 being derived from the organic source material remained in the interior of the vapor phase deposition apparatus 100 by introducing a reactive gas into the interior of the vapor phase deposition apparatus 100.

A method for forming a thin film (metal compound film 104) by employing a vapor phase deposition apparatus 100, comprise: processing an interior of a vapor phase deposition apparatus 100 by employing the method for processing the interior of the vapor phase deposition apparatus 100; and forming a thin film within the interior of the vapor phase deposition apparatus 100 after processing the interior of the vapor phase deposition apparatus 100.

Figure 6:
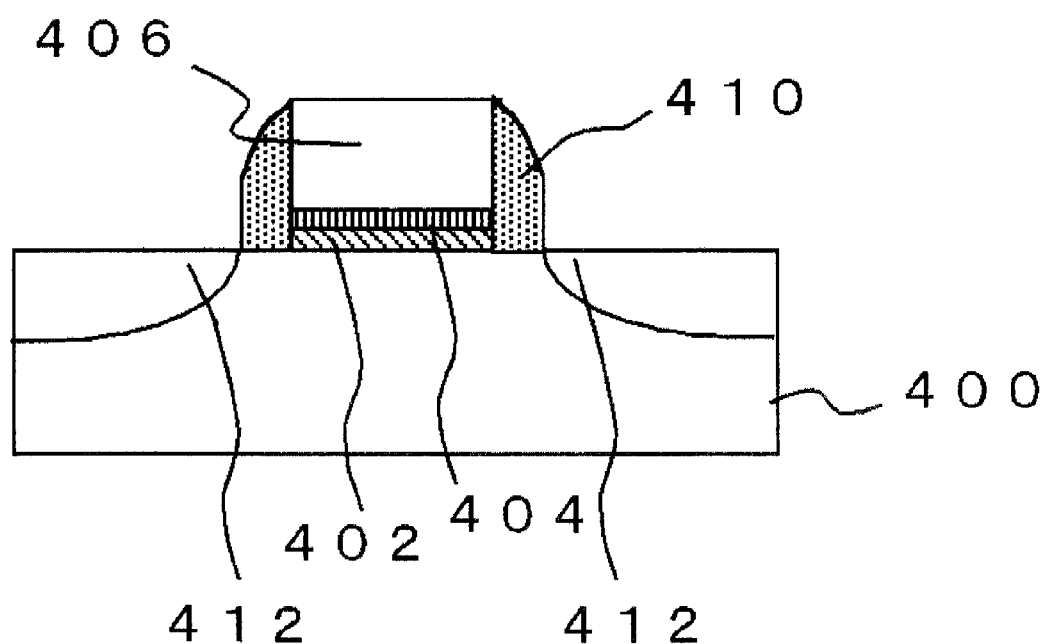
FIG. 6 is a schematic cross sectional view showing a structure of a transistor according to the embodiment.

A method for manufacturing a semiconductor device (MOSFET) shown in FIG. 6 by employing a vapor phase deposition apparatus 100, comprises: forming a thin film (metal compound film 104) on a semiconductor substrate (silicon substrate 400) within an interior of the vapor phase deposition apparatus 100; unloading the semiconductor substrate having the thin film formed on the semiconductor substrate from the interior of the vapor phase deposition apparatus 100 after forming the thin film on the semiconductor substrate; processing the interior of the vapor phase deposition apparatus 100 by employing the method for processing the vapor phase deposition apparatus 100, after unloading the semiconductor substrate; and forming a thin film on another semiconductor substrate, after processing the interior of the vapor phase deposition apparatus 100 and loading the another semiconductor substrate in the interior of the vapor phase deposition apparatus 100.

FIRST EMBODIMENT

Figure 1:
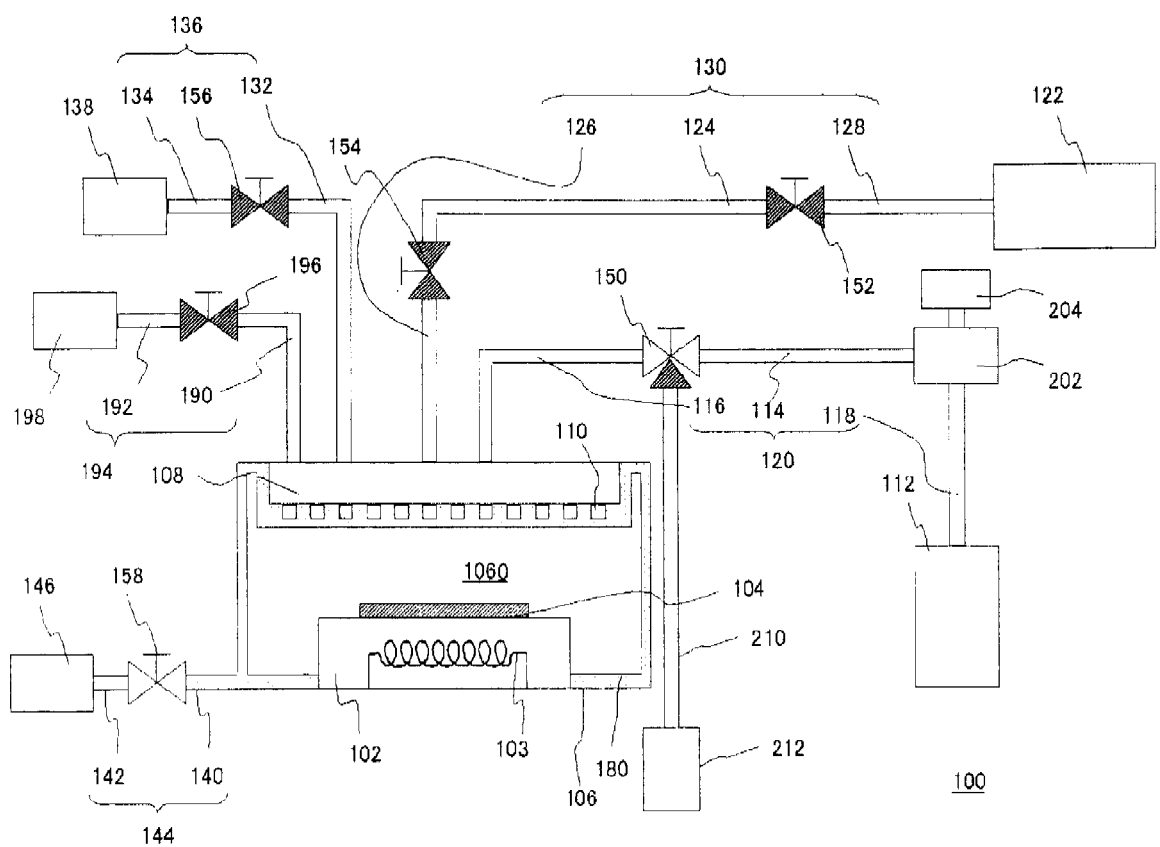
FIG. 1 is a schematic cross sectional view of a vapor phase deposition apparatus of an embodiment according to the present invention, illustrating a deposition of a thin film with a first source gas.

FIG. 1 is a schematic cross sectional view of a vapor phase deposition apparatus 100 of an embodiment according to the present invention, illustrating a deposition of a thin film with a first source gas.

A method for processing an interior of the vapor phase deposition apparatus 100 (cleaning method) according to the present embodiment is a method for processing an interior of the vapor phase deposition apparatus 100, which is conducted after carrying out a deposition of a thin film (after forming a metal compound film on a wafer 104 on a support 102) by employing an organic source material (a source gas including Zr or Hf) transported through a source material container 112 and a source material supplying piping 120 into the interior of the vapor phase deposition apparatus (vapor phase deposition apparatus 100), and comprises introducing a reactive gas such as oxidizing gas and the like in the interior of the vapor phase deposition apparatus 100 through an oxidizing gas inlet 198 and an oxidizing gas supplying piping 194, to immobilize the unreacted organic compound derived from the source gas (unreacted organic compound 180) remained in the interior of the vapor phase deposition apparatus 100.

According to this cleaning method (method for providing cleanliness), since the unreacted organic compound 180 derived from the source gas including Zr or Hf is immobilized by using the reactive gas such as oxidizing gas and the like, the adhesion of the particles of the unreacted organic compound 180 flaked off from the chamber interior walls or the like onto the metal compound film in the wafer 104 mounted on the support 102 is prevented when the metal compound film is formed in the interior of the vapor phase deposition apparatus 100 thereafter. Thus, when the metal compound film is formed by employing the vapor phase deposition apparatus 100, the interior surface of which has been cleaned according to such cleaning method, the metal compound film having higher quality can be stably formed with higher production efficiency.

In order to more specifically describe the present embodiment, the configuration of the vapor phase deposition apparatus 100 shown in FIG. 1 will be described as follows.

A supporting member 102 comprising a heater 103 is disposed in the interior of a chamber 1060. The heater 103 is provided in the support 102, and for example, a semiconductor wafer 104 is mounted on the support 102, and is heated. A shower head 108 is provided in the upper portion of the chamber 1060, and a gaseous mixture of the above-described source gas and other types of source gases, an oxidizing gas and a purge gas is sprayed therein through perforations 110 of the shower head 108 according to a predetermined sequence to deposit the thin film on the semiconductor wafer 104.

The vapor phase deposition apparatus 100 comprises four supplying pipings consisting of a source material supplying piping 120, a source material supplying piping 130, a purge gas supplying piping 136 and an oxidizing gas supplying piping 194, that are communicated with the shower head 108 of the chamber 1060.

A three way valve 150 and a vaporizer 202 is provided along the source material supplying piping 120. A piping 116 extended between a three way valve 150 and the shower head 108 constitutes one side of the source material supplying piping 120. A piping 114 extended between the vaporizer 202 and the three way valve 150 constitutes the other side of the source material supplying piping 120. In the three way valve 150, one port, which is not connected to the piping 114 or the piping 116, is connected to a source exhaust piping 210, functioning as a source exhaust unit, and a source exhaust slot 212 is provided at a further location.

In addition, the piping 118 is provided in the opposite side of the shower head 108 opposite to the vaporizer 202 along the source material supplying piping 120, and is communicated with the source container 112. The source container 112 is maintained at a room temperature, and is capable of storing therein a source material such as tetraethyl methyl amino zirconium (TEMAZ) and the like in a liquid condition.

A piping 126 in vicinity of the chamber extended between a valve 154 and the shower head 108 constitutes a portion of the source material supplying piping 130. An intermediate region 124 extended between the valve 154 and the valve 152 also constitutes a portion of the source material supplying piping 130. A piping 128 remote from the chamber provided in the opposite side over the valve 152 opposite to the side of the shower head 108 also constitutes a portion of the source material supplying piping 130, and is communicated with the source material container 112.

In addition, a purge gas inlet 138 communicates with the shower head 108 through the purge gas supplying piping 136 The valve 156 is provided along the purge gas supplying piping 136, A piping 132 extended between the valve 156 and the shower head 108 constitutes one side of the purge gas supplying piping 136. The piping 134 provided in the opposite side to the valve 156 opposite to the side of the shower head 108 also constitutes a portion of the purge gas supplying piping 136, and is communicated with the purge gas inlet 138.

In addition, the oxidizing gas inlet 198 communicates with the shower head 108 through the oxidizing gas supplying piping 194. A valve 196 is provided along the oxidizing gas supplying piping 194. A piping 190 extended between the valve 196 and the shower head 108 constitutes a portion of the oxidizing gas supplying piping 194. A piping 192 provided in the opposite side over the valve 196 opposite to the side of the shower head 108 also constitutes a portion of the oxidizing gas supplying piping 194, and is communicated with the oxidizing gas inlet 198.

In addition, the lower portion of the chamber 1060 is provided with an outlet piping 144 and an outlet port 146 communicated with the outlet piping 144 to form a configuration of exhausting the gas that has been introduced into the chamber 1060. A valve 158 is provided along the outlet piping 144 to provide a control for opening and closing of the outlet piping 144. The outlet piping 144 is branched at the valve 158 into a piping 140 and a piping 142.

Next, a process sequence for manufacturing a thin film by using such vapor phase deposition apparatus will be described.

Figure 2:
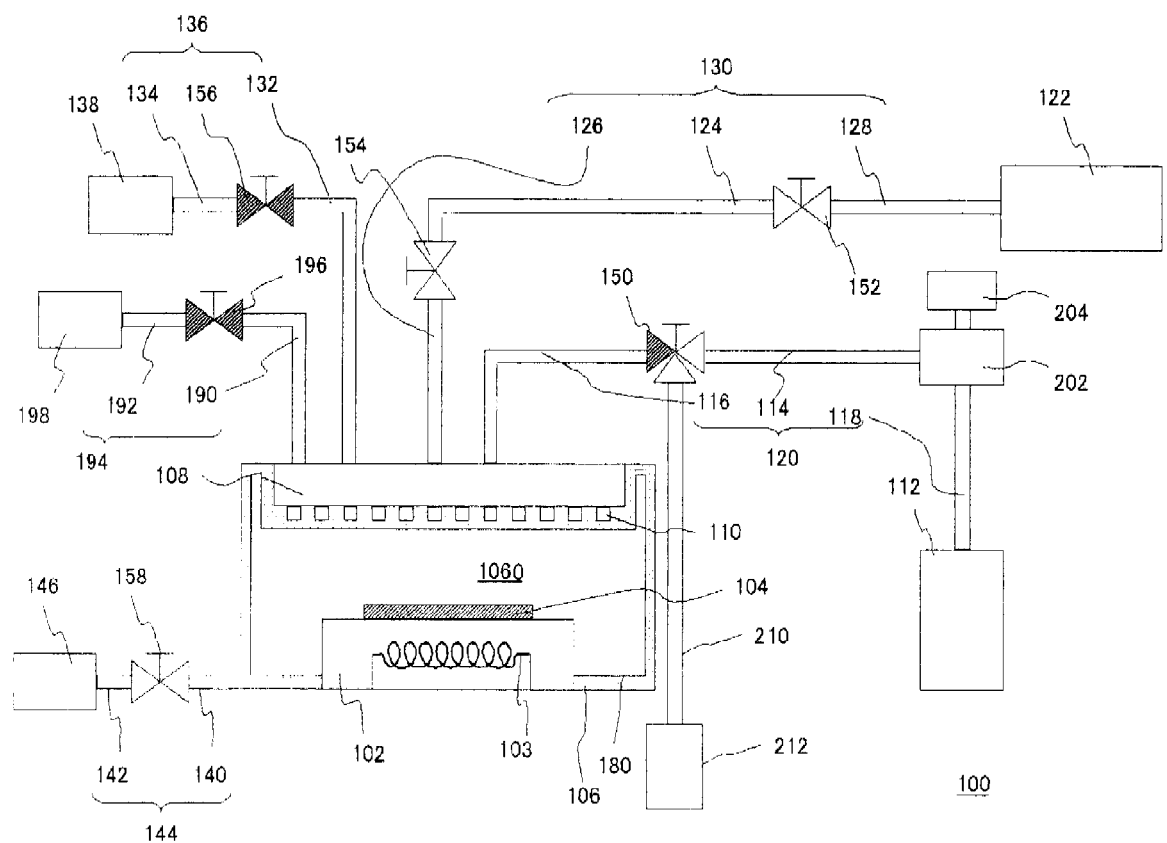
FIG. 2 is a schematic cross sectional view of the vapor phase deposition apparatus of the embodiment according to the present invention, illustrating a deposition of a thin film with a second source gas.
Figure 3:
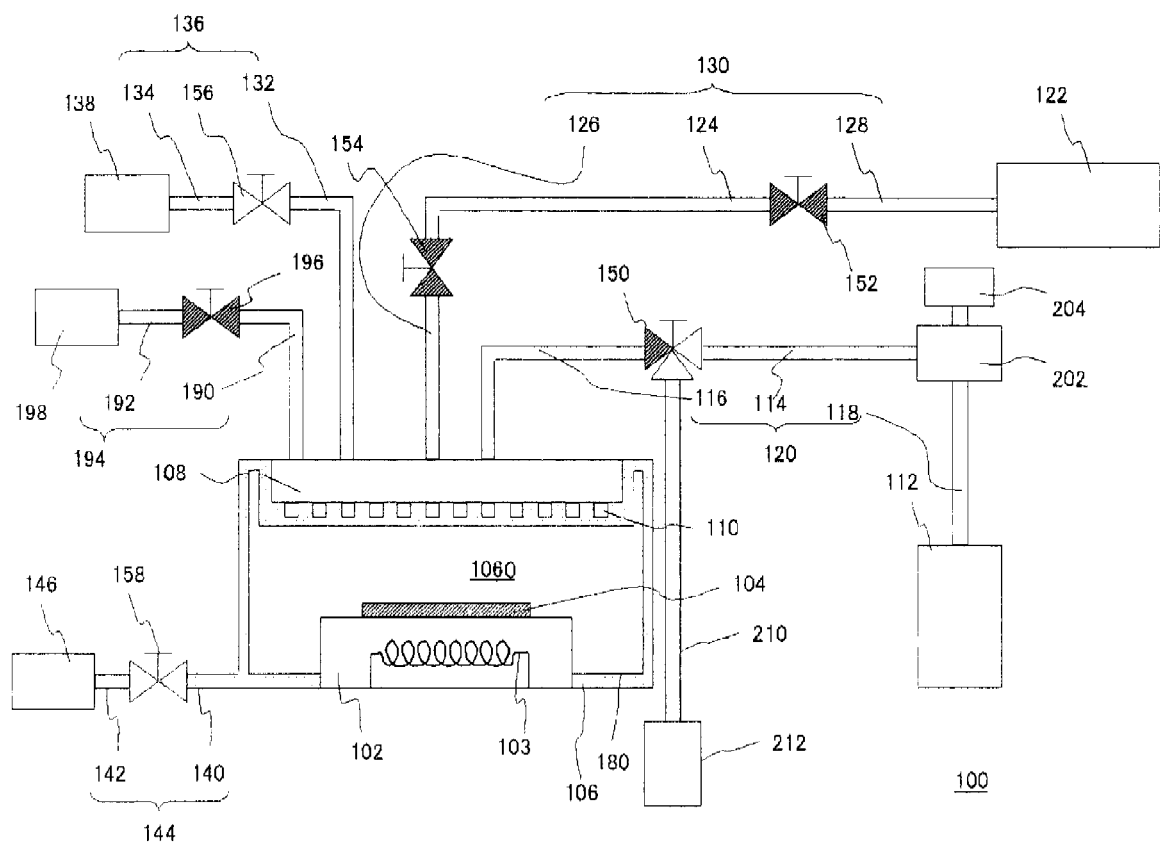
FIG. 3 is a schematic cross sectional view of the vapor phase deposition apparatus of the embodiment according to the present invention, illustrating a purging with a purge gas.
Figure 5:
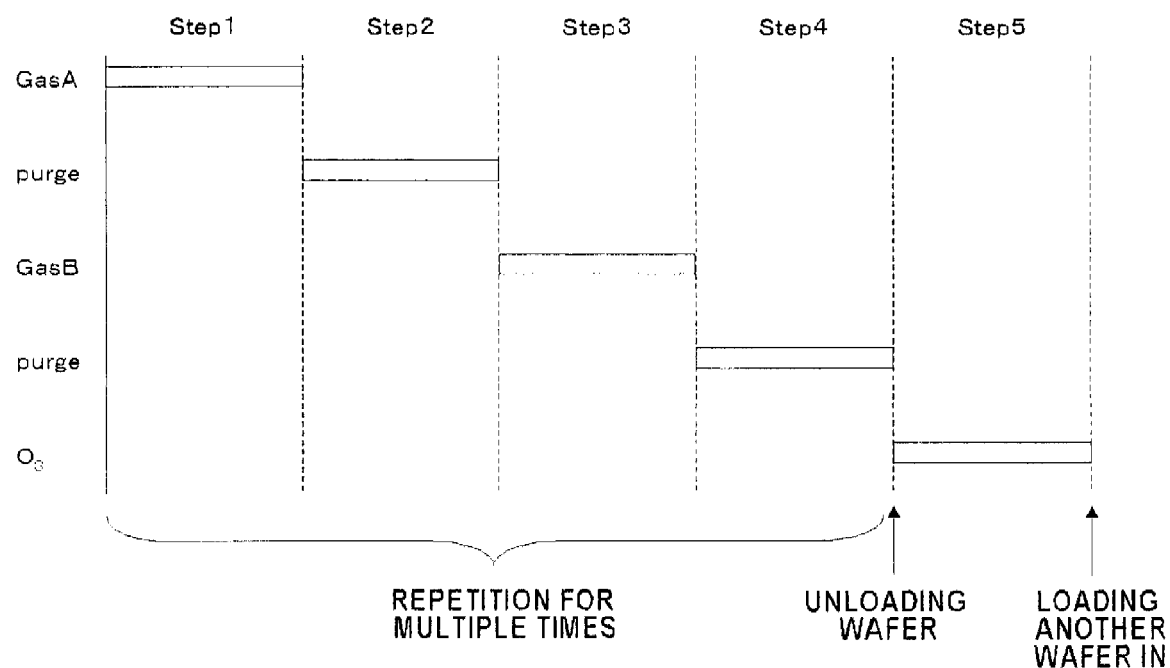
FIG. 5 is a chart, showing an example of a process sequence for manufacturing a metal compound film by employing the vapor phase deposition apparatus according to the embodiment.

FIG. 5 is a timing chart, showing an example of a process sequence for manufacturing a metal compound film by employing a vapor phase deposition apparatus 100 according to the present embodiment. As described above, a first source gas ("gas A") is introduced to deposit a metal compound film by using the vapor phase deposition apparatus 100 as shown in FIG. 1, as a first forming process step (step 1). Then, a purge gas ("purge") is introduced as shown in FIG. 3, as a second forming process step (step 2). Subsequently, a second source gas ("gas B") is introduced as shown in FIG. 2, as a third forming process step (step 3). Further, a purge gas ("purge") is introduced as shown in FIG. 3, as a fourth forming process step (step 4). These steps are respectively conducted in around 0.1 second to 30 seconds.

Repetitions of the deposition via a chemical vapor deposition (CVD) technique or an atomic layer deposition (ALD) technique are conducted by repeating such sequence to obtain the metal compound film having a desired film thickness. In such case, repetition number of the sequence may be suitably selected and/or other additional forming processes may be included, depending upon the purposes.

Figure 4:
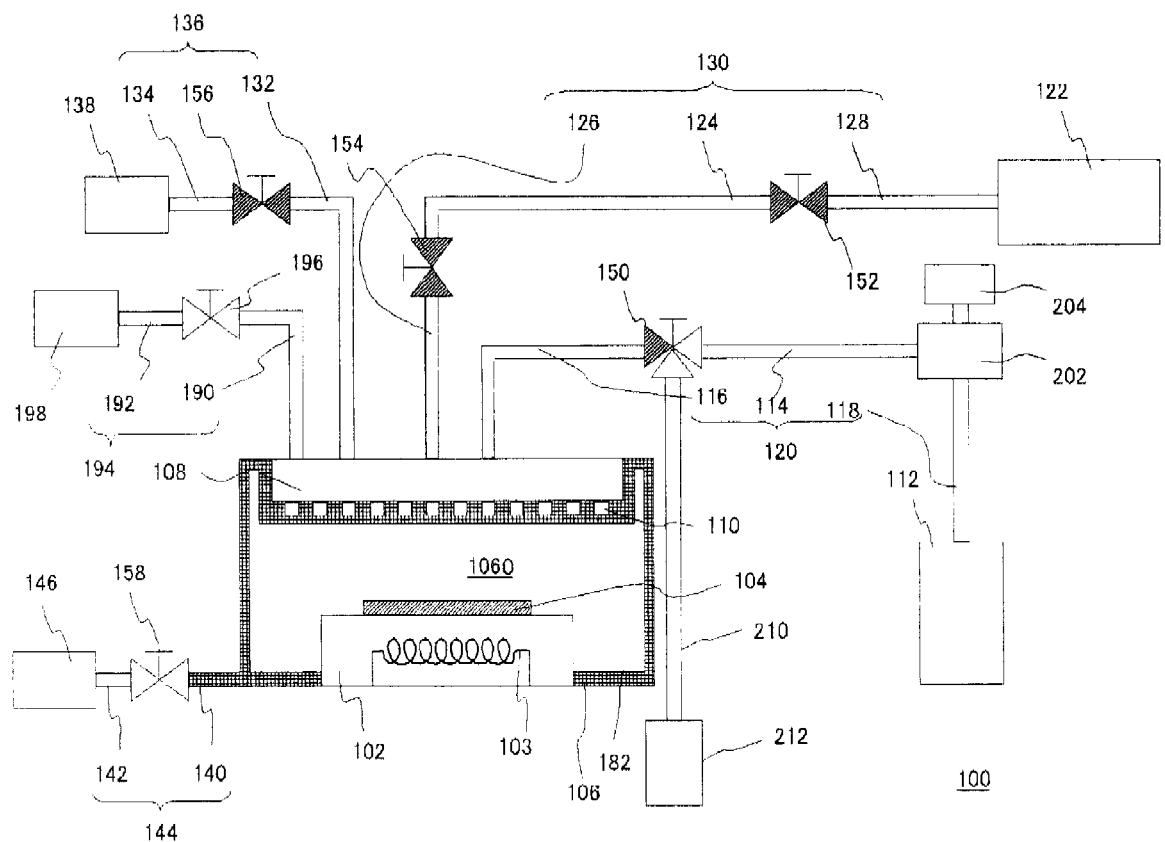
FIG. 4 is a schematic cross sectional view of the vapor phase deposition apparatus of the embodiment according to the present invention, illustrating an oxidation of an unreacted compound with $O_3$ gas.

Then, the sequence is repeated to form the thin film on the wafer, and thereafter, the wafer is unloaded out from the interior of the vapor phase deposition apparatus 100, and then, $O_3$ gas is introduced as shown in FIG. 4, as a fifth forming process step (step 5).

The sequence is designed to conduct a plurality of implementations of the step 1 to the step 4 shown in FIG. 5 in sequence and thereafter the wafer is unloaded and then the step 5 is conducted. More specifically, as shown in FIG. 1 to FIG. 3, the process for supplying the first source gas, the process for supplying the purge gas, the process for supplying the second source gas and the process for supplying the purge gas are sequentially repeated for multiple times, and then, the wafer having the thin film formed thereon is unloaded from the interior of the vapor phase deposition apparatus 100, and then, the process for supplying the oxidizing gas (reactive gas) such as $O_3$ gas may be carried out in accordance with FIG. 4. Then, the unreacted organic compound 180 contained in the interior of the vapor phase deposition apparatus 100 is immobilized by using the oxidizing gas, and thereafter, another wafer is loaded in the vapor phase deposition apparatus 100, and then a plurality of implementation of the step 1 to the step 4 are conducted in sequence to form a thin film on another wafer.

As such, after the above-described process sequences are repeated for multiple times, the wafer having the thin film formed thereon is unloaded from the interior of the vapor phase deposition apparatus 100, and then the process for immobilizing the unreacted organic compound 180 derived from the source gas with the oxidizing gas such as $O_3$ gas and the like is carried out, and thus this means that the process for immobilizing the unreacted organic compound 180 derived from the source gas is conducted between the lot processes for forming the metal compound film (one lot process can be designed to process 25 pieces of wafers, for example) or in every time after deposition for the wafer, that is, the process for depositing the film on a wafer.

Having such process, even if the lot processes for the wafers are or the deposition for the wafer is further carried out after immobilizing the unreacted organic compound 180 derived from the source gas, the adhesion of the particles of the unreacted organic compound 180 flaked off from interior walls of the chamber 1060 or the like onto the metal compound film can be prevented.

In addition, since the wafer having the thin film formed thereon is unloaded from the interior of the vapor phase deposition apparatus 100 and then the process for introducing the oxidizing gas such as $O_3$ gas for immobilizing the unreacted organic compound 180 derived from the source gas is all at once conducted in every time after a plurality of implementations of the forming of the thin film are conducted, the throughput per unit time can be increased. Thus, the metal compound film having higher quality can be stably formed with higher productive efficiency, according to such process.

Next, status of an operation for depositing a thin film on the semiconductor wafer employing the vapor phase deposition apparatus 100 shown in FIG. 1 will be described. It is noted that FIG. 1 illustrates a status of opening and shutting the valve, which corresponds to the status in the step 1 shown in FIG. 5. The opening/closing statuses of the valve are distinguished in the figures by means of providing patterning, and more specifically, a patterned valve indicates to be in the closing status, and unpatterned valve indicates to be in the opening status.

Since the valve 158 and the three way valve 150 in FIG. 1 are opened, the first source material (for example, TEMAZ) is transferred from the source material container 112 though the piping 118 and introduced into the vaporizer 202 in a form of a liquid, and the introduced source material is heated to be vaporized in the vaporizer 202 in the vapor phase deposition apparatus 100 for depositing the thin film. Further, the vaporized gas is transferred sequentially through the intermediate portion 114, the three way valve 150 and the piping 116, and is introduced into the chamber 1060 via the perforations 110 of the shower head 108.

The source gas introduced in the interior of the chamber 1060 reacts with an upper portion of the wafer 104 mounted on the supporting member 102. Since the valve 158 is opened, byproducts generated after the reaction and the unreacted source gas are transferred through the piping 140, the valve 158 and the piping 142 in this order and are eventually exhausted out via the outlet port 146.

Here, since the valve 154 and the valve 152 along the second source material supplying piping 130 are closed, a second source gas, description of which will be made later, is not supplied. In addition, since the valve 156 along the purge gas supplying piping 136 is also closed, a purge gas, description of which will be made later, is not supplied. Further, since the valve 196 along the oxidizing gas supplying piping 194 is also closed, the reactive gas such as oxidizing gas, description of which will be made later, is not also supplied.

While the available source material in the source material container 112 is not particularly limited in the step 1, a source material containing a chemical compound including Hf or Zr, such as $HfO_2$, $ZrO_2$ and the like, for example, may be preferably employed for forming the high dielectric constant film.

Particularly preferable chemical compound including Hf or Zr may be a chemical compound containing Hf or Zr, N and a hydrocarbon group, and the source material containing such compound may be preferably employed. Such chemical compound may be, for example, a compound having a general formula of: $M(NRR')_4$ (where M contains at least one of Hf and Zr, and R and R' are same or different hydrocarbon group(s)). R and R' may preferably be alkyl group having 6 or less carbons/carbon, and more specifically, methyl group, ethyl group, propyl group, tertiary butyl group or the like may be employed. The use of such compounds provides stable deposition of the high dielectric constant film. In addition, the use of such compounds also inhibits a contamination of particles derived from the organic source material contained in the gaseous source material, and thus further improvement of the film quality of the deposited high dielectric constant film can be achieved.

More specifically, the preferable compounds may be: $Zr(N(C_2H_5)_2)_4$ (tetra diethyl amino zirconium, TDEAZ) or $Zr(NCH_3C_2H_5)_4$ (TEMAZ) or the like. Selection of such chemical compounds provides a film having a smooth surface, and prevents a contamination to the film with particles. As a result, the high dielectric constant film providing lower leakage current and having better film quality can be obtained.

CVD or ALD are conducted via the later-described process utilizing the above-described source materials, so that a thin film comprising $ZrO_xC_yN_z$ (where x, y and z are selected to satisfy $0<x$, $0.1 \leq y \leq 1.25$, $0.01 \leq z$ and $x+y+z=2$) can be obtained. Thin film having such specified composition provides higher capacity and considerably reduced leakage current. Therefore, the film can be preferably employed for a capacitor film in a capacitor device, a gate insulating film in a gate electrode of a transistor and the like.

Here, the deposition temperature for depositing the thin film on the upper portion of the wafer 104 mounted on the support 102 in the case of employing $Zr(NRR')_4$ as the source material may be preferably 200 degree C. to 400 degree C., in both occasions of supplying the deposition gas including $Zr(NRR')_4$ and supplying the oxidizing gas described later. Contamination to the thin film with the impurity can be inhibited by selecting the deposition temperature of not lower than 200 degree C. Further, by selecting the deposition temperature of not higher than 400 degree C., particle size of the crystallized particle can be smaller and the leakage current can be reduced. These temperatures are controlled by the heater 103 provided within the supporting member 102.

On the other hand, in order to inhibit the deposition onto the chamber wall 106 or the shower head 108, these temperatures are maintained at a temperature that is not higher than the deposition temperature. More specifically, the temperature is lower by around 100 degree C. to 200 degree C. than the temperature of the wafer 104. When the deposition is conducted by using such temperature condition, the unreacted organic compound 180 remains on the chamber wall 106 or the shower head 108.

In general, the unreacted organic compound 180 has not been sufficiently immobilized on the chamber 1060 or the shower head 108 under such condition. Thus, when the quantity of the unreacted organic compound 180 is increased, the adhesion of the particles of the unreacted organic compound 180 flaked off from the interior walls of the chamber 1060 or the like onto the metal compound film in the wafer 104 mounted on the supporting member 102 may be occurred. As a result, it is difficult to stably form the metal compound film having higher quality.

On the contrary, the present embodiment involves, after unloading the wafer from the interior of the chamber 1060, introducing the reactive gas such as $O_3$ gas into the chamber 1060 to immobilize the unreacted organic compound 180 onto the chamber 1060 or the shower head 108. Therefore, the adhesion of the particles onto the wafer can be inhibited.

FIG. 3 schematically illustrates a status of the vapor phase deposition apparatus 100 according to the present embodiment during the introduction of the purge gas. This corresponds to the step 2 in FIG. 5. The vapor phase deposition apparatus 100 shown in FIG. 3 has substantially the same constitution as the constitution of the vapor phase deposition apparatus 100 shown in FIG. 1, except that the three way valve 150 along the first source material supplying piping 120 communicates with the outlet piping 210 Thus, the supply of the first source gas to the chamber is stopped. Further, the valve 152 and the valve 154 along the second source gas supplying piping 130 are also closed. Thus, the supply of the second source gas is also stopped.

On the other hand, since the valve 156 along the purge gas supplying piping 136 is opened, the purge gas in the purge gas inlet 138 is transported through the piping 134, the valve 156 and the piping 132 in this order, and is introduced into the chamber 1060 from the perforations 110 of the shower head 108. Here, an inert gas represented by $N_2$, Ar or the like may be employed as the purge gas.

Since the valve 158 is opened, the purge gas introduced into the chamber 1060 flushes or purges the residual first source gas remained in the chamber 1060 out, and the flushed residual first source gas is transported sequentially through the piping 140, the valve 158 and the piping 142 to be exhausted from the outlet port 146.

As such, since the purge gas can be employed to remove most of the unreacted source gas from the interior of the vapor phase deposition apparatus 100, the unreacted organic compound 180 remained in the interior of the vapor phase deposition apparatus 100 can be reduced. Therefore, in the interior of the vapor phase deposition apparatus 100, the amount of the particles of the unreacted organic compound 180 flaked off from the interior walls of the chamber 1060 or the like adhered on the metal compound film on the wafer 104 mounted on the supporting member 102 can be reduced.

FIG. 2 schematically illustrates a status of the vapor phase deposition apparatus 100 during the introduction of the second source gas. This corresponds to the step 3 in FIG. 5. When the introduction of the purge gas shown in FIG. 3 is completed, then the second source gas is introduced therein, as shown in FIG. 2. The vapor phase deposition apparatus 100 shown in FIG. 2 has substantially the same constitution as the constitution of the vapor phase deposition apparatus 100 shown in FIG. 1, except that the three way valve 150 along the first source material supplying piping 120 communicates with the outlet piping 210. Thus, the supply of the first source gas into the chamber is stopped. Further, the valve 156 along the purge gas supplying piping 136 is also closed. Thus, the supply of the purge gas is also stopped.

On the other hand, since the valve 152 and the valve 154 along the second source material supplying piping 130 are opened, the second source gas contained in the second source material container 122 is transported sequentially through the piping 128, the valve 152, the piping 124, the valve 154 and the piping 126, and is introduced into the chamber 1060 from the perforations 110 of the shower head 108.

The second source gas introduced in the interior of the chamber 1060 reacts with an upper portion of the wafer 104 mounted on the supporting member 102. Since the valve 158 is opened, byproducts generated after the reaction and the unreacted second source gas are transferred through the piping 140, the valve 158 and the piping 142 in this order and are eventually exhausted out via the outlet port 146.

When the thin film having higher dielectric constant is formed by utilizing a source gas containing a chemical compound including Hf or Zr as a first source gas, it is preferable to employ an oxidizing gas as the second source gas. Typical oxidizing gas includes oxygen or a chemical compound including oxygen. More specifically, the typical compounds may be NO, $NO_2$, $N_2O$, $H_2O$, $O_2$, $O_3$ and the like. Among these compounds, NO, $NO_2$ and $N_2O$ are preferable, and gaseous mixture of NO and $NO_2$ and NO and $O_3$, which represent combination of nitriding gas and oxidizing gas, are relatively more preferable.

Stable deposition of the high dielectric constant film having better film quality can be obtained by selecting such compounds. Further, while $H_2O$ is comparatively prone to be remained within the chamber in the process employing $H_2O$ that has been frequently employed as an oxidizing gas, NO, $N_2O$ and $NO_2$ are prone to be removed from the inside of the chamber by purging, thereby improving the productive efficiency.

When the first source gas is metal containing deposition gas and the second source gas is an oxidizing gas, it is preferable to select the volumetric ratio of these compounds (that is, volume of metal containing deposition gas/volume of oxidizing gas) of equal to or less than centesimal (1/100). Such volumetric ratio helps reducing impurities contained in the film.

When a gaseous mixture of NO and $NO_2$ is employed as an oxidizing gas, ratio of NO/$NO_2$ is preferably equal to or less than 1/10000. The pressure in the deposition process is, for example, within a range of from 10 mTorr to 10 Torr.

Since the temperature of the chamber wall 106 or the shower head 108 is, in general, lower by around 100 degree C. to 200 degree C. than the temperature of the wafer 104, the unreacted organic compound 180 remained on the portion is not fully oxidized even if the oxidizing gas is employed as the second source gas in this way. Thus, the unreacted organic compound 180 is not fully immobilized on the chamber wall 106 or shower head 108, and therefore the particles of the unreacted organic compound 180 may be flaked off from the interior walls of the chamber 1060 or the like to be adhered onto the metal compound film in the wafer 104 mounted on the supporting member 102 in the interior of the vapor phase deposition apparatus 100.

On the other hand, since the present embodiment involves additionally supplying the reactive gas such as oxidizing gas under the conditions of with sufficiently higher concentration, at sufficiently higher flow rate and for sufficiently longer time than the condition for the case employing the oxidizing gas as the second source gas, as shown in FIG. 4 described later, the unreacted organic compound 180 remained on the portion can be fully oxidized, even if the temperature of the chamber wall 106 or the shower head 108 is lower by around 100 degree C. to 200 degree C. than the temperature of the wafer 104. Thus, the unreacted organic compound 180 can be fully immobilized on the chamber wall 106 or shower head 108, and therefore the quantity of the particles of the unreacted organic compound 180 flaked off from the interior walls of the chamber 1060 or the like to be adhered onto the metal compound film in the wafer 104 mounted on the supporting member 102 in the interior of the vapor phase deposition apparatus 100 can be reduced.

FIG. 3 schematically illustrates a status of the vapor phase deposition apparatus 100 according to the present embodiment during the introduction of the purge gas. After completing the introduction of the second source gas shown in FIG. 2, then, a purge gas is introduced therein, as shown in FIG. 3. Here, the process for introducing the purge gas has been described above, and therefore further description thereof will not be presented here.

FIG. 4 is a schematic cross-sectional view of the vapor phase deposition apparatus 100 according to the present embodiment, illustrating the structure in oxidizing of an unreacted compound with $O_3$ gas. As shown in the above-stated FIG. 1 to FIG. 3, the process for supplying the first source gas, the process for supplying the purge gas, the process for supplying the second source gas and the process for supplying the purge gas are sequentially repeated for multiple times, and then, the wafer having the thin film formed thereon is unloaded from the interior of the vapor phase deposition apparatus 100, and then, $O_3$ gas is introduced as shown in FIG. 4.

The vapor phase deposition apparatus 100 shown in FIG. 2 has substantially the same constitution as the constitution of the vapor phase deposition apparatus 100 shown in FIG. 1, except that the valve 156 along the purge gas supplying piping 136 is closed. Thus, the supply of the purge gas is stopped.

On the other hand, since the valve 196 along the oxidizing gas supplying piping 194 is opened, the reactive gas such as the oxidizing gas within the oxidizing gas inlet 198 is sequentially transported through the piping 192, the valve 196 and the piping 190, and is introduced into the chamber 1060 from the perforations 110 of the shower head 108.

The oxidizing gas introduced in the interior of the chamber 1060 chemically reacts with the unreacted organic compound 180 existing on the surface of the chamber wall 106 or the shower head 108 to form an oxide 182 that is derived by oxidizing the unreacted organic compound 180. Since the valve 158 is opened, byproducts generated after the reaction and the unreacted oxidizing gas are transferred through the piping 140, the valve 158 and the piping 142 in this order and are eventually exhausted out via the outlet port 146.

In this occasion, when the oxidizing gas such as $O_3$ gas is employed as the reactive gas, the flow rate of $O_3$ gas may be selected to be equal to or higher than 100 sccm, for example, and more preferably equal to or higher than 200 sccm. In addition, the flow rate of $O_3$ gas may also be selected to be equal to or lower than 2000 sccm, for example, and more preferably equal to or lower than 1500 sccm. If the flow rate of $O_3$ gas is within the above-described range, the advantageous effect obtained by oxidizing the unreacted organic compound 180 in the interior of the vapor phase deposition apparatus 100 to immobilize thereof can be improved.

In addition, the concentration of $O_3$ gas may be selected to be equal to or higher than 50 g/Nm$^3$, for example, and more preferably equal to or higher than 100 g/Nm$^3$. Further, the concentration of $O_3$ gas may be selected to be equal to or lower than 300 g/Nm$^3$, for example, and more preferably equal to or lower than 250 g/Nm$^3$. If the concentration of $O_3$ gas is within the above-described range, the advantageous effect obtained by oxidizing the unreacted organic compound 180 in the interior of the vapor phase deposition apparatus 100 to immobilize thereof can be improved.

In addition, the pressure of $O_3$ gas may be selected to be equal to or higher than 0.05 Torr, for example, and more preferably equal to or higher than 0.1 Torr. Further, the pressure of $O_3$ gas may be selected to be equal to or lower than 50 Torr, for example, and more preferably equal to or lower than 20 Torr. If the pressure of $O_3$ gas is within the above-described range, the advantageous effect obtained by oxidizing the unreacted organic compound 180 in the interior of the vapor phase deposition apparatus 100 to immobilize thereof can be improved. Introduction of $O_3$ gas into the chamber 1060 may be continued for a duration time, which is longer than that for the oxidation step in the ordinary deposition process, for example for not shorter than 30 second, since the unreacted product, which cannot be simultaneously oxidized during the deposition step, is oxidized in this step.

Here, the deposition temperature for depositing the metal compound film in the wafer 104 mounted on the supporting member 102 in the case of employing Zr(NRR')$_4$ as the source material may be preferably 200 degree C. to 400 degree C., when the reactive gas such as $O_3$ gas is supplied. Contamination of the impurity to the metal compound film can be inhibited by selecting the deposition temperature of not lower than 200 degree C. Further, by selecting the deposition temperature of not higher than 400 degree C., particle size of the crystallized particle can be smaller and the leakage current can be reduced. The temperature is controlled by the heater 103 provided within the supporting member 102.

Further, temperature of the chamber wall 106 or the shower head 108 may be preferably 25 degree C. to 150 degree C., when the reactive gas such as $O_3$ gas is supplied. Condensation of the source gas on the surface of the chamber wall 106 or the shower head 108 can be inhibited by selecting the deposition temperature of not lower than 25 degree C. Formation of the metal compound film on the surface of the chamber wall 106 or the shower head 108 can be inhibited by selecting the deposition temperature of not higher than 150 degree C., and thus the source gas can be effectively utilized.

Advantageous effects obtained by the present embodiment will be described as follows.

According to the present embodiment, a source gas containing Hf or Zr is further introduced under the condition of having the immobilized unreacted organic compound 180 in the interior of the vapor phase deposition apparatus 100. Thus, even if the metal compound film is further formed due to the source gas, the adhesion of the particles of the unreacted organic compound 180 flaked off from the interior walls of the chamber 1060 or the like onto the metal compound film in the wafer 104 mounted on the supporting member 102 is prevented, and thus the metal compound film having higher quality can be stably formed with higher productive efficiency.

In addition, according to the present embodiment, since the wafer having the thin film formed thereon is unloaded from the interior of the vapor phase deposition apparatus 100 and then the process for immobilizing the unreacted organic compound 180 derived from the source gas is conducted in every time after a plurality of implementations of process for introducing the source gas containing Hf or Zr, the process for immobilizing the unreacted organic compound 180 derived from the source gas can be carried out in every time in the interval between the lot processes for the metal compound films or in every time after the deposition process for a wafer.

Thus, even if another wafer having no thin film formed thereon is loaded in the interior of the vapor phase deposition apparatus 100 and the lot processes for the wafers or the depositions for the wafers are further carried out after immobilizing the unreacted organic compound 180 derived from the source gas, the adhesion of the particles of the unreacted organic compound 180 flaked off from interior walls of the chamber 1060 or the like onto the metal compound film in the wafer 104 mounted on the supporting member 102 is prevented.

Further, since the wafer having the thin film formed thereon is unloaded from the interior of the vapor phase deposition apparatus 100 and then the process for immobilizing the unreacted organic compound derived from the source gas is all at once conducted, after the processes for forming the thin film on one piece of wafer are conducted for a plurality of wafer, the throughput per unit time can be increased. Thus, the metal compound film having higher quality can be stably formed with higher productive efficiency, according to such process.

More specifically, in the vapor phase deposition apparatus 100 for depositing an oxide containing compound containing Zr or Hf by employing a deposition source material having lower vapor pressure such as a source gas containing $Zr(NRR')_4$ or $Hf(NRR')_4$ according to the present embodiment, the unreacted organic compound 180 containing $Zr(NRR')_4$ or $Hf(NRR')_4$, which is remained in the interior of the chamber 1060, is immobilized by conducting the oxidation process with the oxidizing gas such as $O_3$ gas after unloading the wafer having the thin film formed thereon from the interior of the vapor phase deposition apparatus 100 and before conducting the next deposition process, so that when another wafer is loaded in the interior of the vapor phase deposition apparatus 100 thereafter and a deposition of a thin film is conducted, the adhesion of the particles flaked off from the interior walls of the chamber 1060 or the like onto the wafer 104 is prevented.

Since the source gas containing $Zr(NRR')_4$ or $Hf(NRR')_4$, which as relatively lower vapor pressure, is prone to be remained within the chamber 1060 as the unreacted organic compound 180, it is difficult to remove thereof using an ordinary gas cleaning process or a purge process. Further, a non-reactive gas or an inert gas is employed in the purge process for the interior of the chamber 1060 when the vapor phase deposition apparatus 100 is not employed in the conventional technology, and therefore it is difficult to reduce the generation of the particles.

When the deposition is conducted under such condition, particles may be generated on the wafer 104 during the introduction of the above-described second source gas having higher oxidizing property, due to an accumulation of the unreacted organic compound 180 in the interior of the chamber 1060. It is considered that the possible cause may be that the unreacted organic compound 180 remains in portions of lower temperature in the interior of the chamber 1060, and a contact angle of the particles of the unreacted organic compound 180 with the chamber wall 106 exceeds a critical angle during the deposition process and the particles are flaked off from the chamber wall 106 and adheres on the wafer. Here, the phenomenon of generating the particles on the wafer 104 due to the residual unreacted organic compound 180 in the interior of the chamber 1060 is discovered by the present inventors for the first time, and the cause thereof has not been found in the conventional technique.

In the present embodiment, the unreacted organic compound 180 containing $Zr(NRR')_4$ or $Hf(NRR')_4$ remained in the interior of the chamber 1060 is immobilized by oxidizing thereof with an oxidizing gas having higher oxidizing property in the process for processing the interior of the chamber 1060 before depositing the metal compound film on the wafer 104. Thus, the generation of the particles on the wafer 104 can be inhibited when the wafer 104 is loaded into the interior of the chamber 1060 to conduct the process for depositing the thin film thereon.

On the other hand, in the technique described in Japanese Patent Laid-Open No. 2000-277,459, particles consisting of inorganic compounds are generated and these compounds are nitrided so as to inhibit the flaking off from the chamber interior wall or the shower head. However, the nitridation process is conducted simultaneously with conducting the deposition process in the first place in the technology of Japanese Patent Laid-Open No. 2000-277,459, and thus the technique is hardly applicable to the cleaning process that conducts after unloading the wafer from the vapor phase deposition apparatus without any modification.

On the contrary, in the technique of the present embodiment, a plurality of the deposition processes are repeated by using the organic source material of larger molecular weight containing an element of large atomic number such as Hf or Zr, and then, the wafer having the thin film formed thereon is unloaded from the vapor phase deposition apparatus 100, and thereafter, the reactive gas is additionally introduced. Then, the organic source material having lower vapor pressure due to the its larger molecular weight as described above and polymers thereof, remained in the interior of the vapor phase deposition apparatus 100 in a liquid form, are immobilized by decarbonizing from molecules of the unreacted organic compound 180. As such, the technique according to the present embodiment is definitely different from the technique described in the Japanese Patent Laid-Open No. 2000-277, 459.

Further, the present embodiment involves, after a plurality of the deposition processes are repeated and the wafer is unloaded from the interior of the vapor phase deposition apparatus 100, immobilizing process for oxidizing the unreacted organic compound 180 to immobilize thereof is carried out, and therefore the throughput per unit time can be improved. Further, after the processed wafer having the thin film deposited thereon is unloaded from the interior of the vapor phase deposition apparatus 100, another wafer having no thin film formed thereon is loaded in the interior of the vapor phase deposition apparatus 100 and the thin film is formed thereon, and thereafter, the immobilizing process for oxidizing the unreacted organic compound 180 to immobilize thereof may be carried out. This operation improves the throughput per unit time. In other words, the immobilizing process for immobilizing the unreacted organic compound 180 may be carried out, in every time after a plurality of implementations of the forming the thin film on the wafer and the forming the thin film on another wafer are conducted.

On the other hand, Japanese Patent Laid-Open No. 2002-134,488 describes a technique for fluorinating a $SiO_2$ film deposited on a chamber interior wall with radicals to remove thereof, by additionally introducing fluorine radical ion after the deposition process steps are repeated for multiple times. When a fluorination is conducted by utilizing radicals, compounds, which are not fluorinated by the thermal fluorination, are successfully fluorinated, and thus can be removed from the chamber.

On the contrary, the present embodiment employs the organic source material containing a heavy metal such as Hf or Zr. Therefore, even if the unreacted organic compound 180 derived from the organic source material is fluorinated by radicals, the vapor pressure of the obtained fluoride is lower, as shown in Table 1, and thus it is difficult to conduct the gas cleaning process in the case of employing the technique described in Japanese Patent Laid-Open No. 2002-134,488. Here, the present embodiment employs a method for immobilizing the unreacted organic compound 180 with the reactive gas such as oxidation gas. As such, the technique according to the present embodiment is definitely different from the technique described in the Japanese Patent Laid-Open No. 2002-134,488.

TABLE 1

VAPOR PRESSURE AT 100 DEGREE C.

| | Material | | | | |
|---|---|---|---|---|---|
| | $TiF_4$ | $ZrF_4$ | $TiCl_4$ | $HfCl_4$ | $ZrCl_4$ |
| Vapor pressure (Torr) | $4 \times 10^{-2}$ | $3 \times 10^{-22}$ | $3 \times 10^2$ | $6 \times 10^{-3}$ | $2 \times 10^{-3}$ |

The reason for employing the method for immobilizing the unreacted organic compound 180 by oxidizing thereof with $O_3$ gas in the present embodiment according to the present invention, instead of employing the gas cleaning process of the interior of the chamber 1060 of the vapor phase deposition apparatus 100 by using fluorine gas or chlorine gas, will be described as follows.

When the cleaning of the interior of the vapor phase deposition apparatus 100 is conducted, chlorine containing gas or fluorine containing is often employed. For example, residual materials containing Ti, TiN or the like is capable of being removed by the gas cleaning process with $ClF_x$. However, when Zr or Hf is employed, chlorine containing or fluorine containing compounds with Zr or Hf have lower vapor pressure by five digits or more than the case of employing Ti. Therefore, the unreacted organic compound 180 containing Zr or Hf is difficult to be gas-cleaned with fluorine gas or chlorine gas. In this reason, in the present embodiment, the method for immobilizing the unreacted organic compound 180 by oxidizing thereof is employed.

In the present embodiment, the unreacted organic compound 180 (deposit) adhered onto the chamber wall 106 of the vapor phase deposition apparatus 100 is removed mechanically after the unreacted organic compound 180 is immobilized. Alternatively, a detachable liner is used for protecting the chamber wall 106, and the unreacted organic compound 180 can be removed by replacing the liner. The mechanical cleaning may be done, after the immobilized film thickness on the chamber wall 106 become the predetermined one by forming the thin film on a plurality of semiconductor substrate and immobilizing the film on the chamber wall 106.

Here, in the case that the removal thereof is conducted by mechanical removal or liner replacement removal in such way, an additional manufacturing process step is not particularly required, even if unreacted organic compound 180 adhered onto the chamber wall 106 is further oxidized to be immobilized (coagulated), and therefore the production efficiency thereof is not particularly deteriorated.

The reason that it is more preferable to employ the method for immobilizing the unreacted organic compound 180 in the interior of the chamber 1060 of the vapor phase deposition apparatus 100 by oxidizing thereof with $O_3$ gas in the present embodiment according to the present invention, rather than nitriding thereof with ammonia gas or the like, will be more specifically described.

The unreacted organic compound 180 is a substance consisting of a composition contain relatively larger amount of carbon, and may be represented by a chemical formula of, for example, $ZrO_xC_yN_zH_w$. In this occasion, carbon contained in molecule of the unreacted organic compound 180 is decarbonized in a form of $CO_2$ or the like together with $H_2O$ by introducing $O_3$. As such, carbon in molecule of the unreacted organic compound 180 is decarbonized to provide a solid film containing smaller amount of carbon, therefore the unreacted organic compound 180 is further immobilized onto the chamber wall 106.

Further, as shown in the following Table 2, concerning the chemical compound containing Zr or Hf, the oxidizing reaction of such compound generally presents more formation energy than the nitriding reaction of such compound, and thus the reactivity of the oxidizing reaction thereof is higher than the nitriding reaction thereof, and therefore the efficiency for immobilizing the unreacted organic compound 180 is improved by oxidizing thereof with $O_3$ gas to immobilize thereof.

TABLE 2

FORMATION ENERGY AT 25 DEGREE C. (kcal/mol)

| | O (Oxidation) | N (Nitridation) |
|---|---|---|
| Zr | −263.1 | −88.0 |
| Hf | −266.0 | −88.2 |

Thus, the chemical compound containing Zr or Hf is prone to form an oxide thereof rather than a nitride thereof, and it is preferable in the present embodiment to employ the method for oxidizing the interior of the chamber 1060, so that the unreacted organic compound 180 is more effectively immobilized.

In addition, when the metal compound film is formed by using vapor phase deposition apparatus 100, the first source gas containing Zr or Hf is employed together with the second source gas containing $O_3$ gas or the like as the source gas for the deposition, as described above. Thus, $O_3$ gas as the second source gas is used as the reactive gas for immobilizing the unreacted organic compound 180, so that the apparatus configuration of the vapor phase deposition apparatus 100 can be simplified, thereby reducing the manufacturing cost for the vapor phase deposition apparatus 100.

SECOND EMBODIMENT

In the present embodiment, a proper amount of a nitriding gas such as ammonia or nitrogen is employed in addition to the oxidizing gas such as $O_3$ gas as the reactive gas for immobilizing the unreacted organic compound 180 during the oxidation process, to immobilize the unreacted organic compound 180 containing $ZrO_xC_yN_zH_w$ by decarbonizing from molecule of the unreacted organic compound 180. Here, a point that is not particularly described in the present embodiment is similar to a point described in the first embodiment. The vapor phase deposition apparatus 100 described in the first embodiment shown in FIG. 1 may be employed for the vapor phase deposition apparatus of the present embodiment.

As such, the nitriding gas such as $NH_3$ may be employed in addition to the oxidizing gas such as $O_3$ gas to oxynitriding the unreacted organic compound 180, thereby effectively immobilizing the unreacted organic compound.

In this occasion, when the oxidizing gas such as $O_3$ gas is employed as the reactive gas, the flow rate of $O_3$ gas may be selected to be equal to or higher than 100 sccm, for example, and more preferably equal to or higher than 200 sccm. In addition, the flow rate of $O_3$ gas may also be selected to be equal to or lower than 2000 sccm, for example, and more preferably equal to or lower than 1500 sccm. If the flow rate of $O_3$ gas is within the above-described range, the advantageous effect obtained by oxynitriding the unreacted organic compound 180 in the interior of the vapor phase deposition apparatus 100 to immobilize thereof can be improved.

In addition, the concentration of $O_3$ gas may be selected to be equal to or higher than 50 g/Nm$^3$, for example, and more preferably equal to or higher than 100 g/Nm$^3$. Further, the concentration of $O_3$ gas may be selected to be equal to or lower than 300 g/Nm$^3$, for example, and more preferably equal to or lower than 250 g/Nm$^3$. If the concentration of $O_3$ gas is within the above-described range, the advantageous effect obtained by oxynitriding the unreacted organic compound 180 in the interior of the vapor phase deposition apparatus 100 to immobilize thereof can be improved.

In addition, the pressure of $O_3$ gas may be selected to be equal to or higher than 0.05 Torr, for example, and more preferably equal to or higher than 0.1 Torr. Further, the pressure of $O_3$ gas may be selected to be equal to or lower than 50 Torr, for example, and more preferably equal to or lower than 20 Torr. If the pressure of $O_3$ gas is within the above-described range, the advantageous effect obtained by oxynitriding the unreacted organic compound 180 in the interior of the vapor phase deposition apparatus 100 to immobilize thereof can be improved.

In such case, when $NH_3$ gas is employed in addition to the oxidizing gas such as $O_3$ gas, the flow rate of $NH_3$ gas may be selected to be equal to or higher than 1 sccm, for example. In addition, the flow rate of $NH_3$ gas may also be selected to be equal to or lower than 2000 sccm, for example. If the flow rate of $NH_3$ gas is within the above-described range, the advantageous effect obtained by oxynitriding the unreacted organic compound 180 in the interior of the vapor phase deposition apparatus 100 to immobilize thereof can be improved. Here, concentration, pressure or the like of $NH_3$ gas may be appropriately selected to provide a preferable range, according to process conditions.

Here, the nitriding gas described above is not limited to $NH_3$ gas, and other gas such as, for example, $N_2$ gas, may also be employed. In addition, a timing for introducing the nitriding gas such as $NH_3$ gas into the chamber 1060 may be the same time as the timing for introducing the oxidizing gas such as $O_3$ gas, or may be either after or before thereof.

The technique in Japanese Patent Laid-Open No. 2000-277,459 describes that the nitridation of the unreacted compound in the interior of the chamber 1060 is carried out by utilizing a gaseous mixture of $NH_3$ and $H_2$.

On the contrary, the nitriding gas such as $NH_3$ is employed in addition to the oxidizing gas such as $O_3$ gas in the above-described embodiment, so that the unreacted organic compound 180 is oxynitrided to be immobilized, and therefore the unreacted organic compound 180 can be immobilized more effectively than the case of introducing $NH_3$ gas alone. As such, the technique according to the present embodiment is also definitely different from the technique described in the Japanese Patent Laid-Open No. 2000-277,459.

Here, when $NH_3$ gas is flowed in addition to the oxidizing gas such as $O_3$ gas, an inert gas such as Ar may also be simultaneously flowed together with $NH_3$ gas.

In addition, the deposition temperature for depositing the metal compound film in the wafer 104 mounted on the supporting member 102 in the case of employing $Zr(NRR')_4$ as the source material may be preferably 200 degree C. to 400 degree C., when the nitriding gas such as a gas containing $NH_3$ is supplied in addition to the oxidizing gas such as $O_3$ gas. Contamination of the impurity to the metal compound film can be inhibited by selecting the deposition temperature of not lower than 200 degree C. Further, by selecting the deposition temperature of not higher than 400 degree C., particle size of the crystallized particle can be smaller and the leakage current can be reduced. The temperature is controlled by the heater 103 provided within the supporting member 102.

Further, temperature of the chamber wall 106 or the shower head 108 may be preferably 25 degree C. to 150 degree C., when the nitriding gas such as a gas containing $NH_3$ is supplied in addition to the oxidizing gas such as $O_3$ gas. Condensation of the source gas on the surface of the chamber wall 106 or the shower head 108 can be inhibited by selecting the deposition temperature of not lower than 25 degree C. Formation of the metal compound film on the surface of the chamber wall 106 or the shower head 108 can be inhibited by selecting the deposition temperature of not higher than 150 degree C., and thus the source gas can be effectively utilized.

In addition, when the nitriding gas such as a gas containing $NH_3$ is supplied in addition to the oxidizing gas such as $O_3$ gas, a remote plasma may be utilized to oxynitride the unreacted organic compound 180, thereby immobilizing the unreacted organic compound.

THIRD EMBODIMENT

The present embodiment relates to a method for forming a thin film by using an organic source material containing a heavy metal except Hf or Zr. The method for depositing a thin film according to the present embodiment is the substantially same as the method described in the first embodiment or the second embodiment except the following points.

While in the above-described embodiment, various types of amino acids containing TEMAZ or the like as a source gas is employed, other source gas having lower vapor pressure may also be employed. Also in such case, since the unreacted compound of a source gas can be immobilized according to the method for depositing the metal compound film of the present invention, the high dielectric constant film having higher quality can similarly be obtained with higher stability.

More specifically, organic source materials containing a heavy metal such as La, Pr, Pb, Sr, Ba, Cu, Ti, Bi and the like and having a vapor pressure of equal to or lower than 1 Torr at 100 degree C. can be employed as an organic source material in the present embodiment. Further, an alternative organic source material may be a compound, which is constituted of a heavy metal such as Hf, Zr, La, Pr, Pb, Sr, Ba, Cu, Ti, Bi and the like and an organic ligand having larger molecular weight coordinated around the heavy metal, such as $N(C_2H_5CH_3)$, $N((C_2H_5)_2)$, OtBu, OiPr, 1-(2-methoxy ethoxy)-2,2,6,6-tetramethyl-3,5-heptane dionate (METHD), 6-methyl-2,4-heptane dionate (MHD), 1-methoxy-2-methyl-3-propoxide (MMP) and the like.

TEMAZ ($Zr(NC_2H_5CH_3)_4$) employed in the first embodiment and the second embodiment has a vapor pressure of 0.5 Torr at 90 degree C., and TEMAH ($Hf(NC_2H_5CH_3)_4$) has a vapor pressure of 1 Torr at 87 degree C. On the other hand, TiN formed by using an inorganic source material can be cleaned by utilizing a chlorine containing gas, and the chloride thereof, that is, $TiCl_4$, has a vapor pressure of $3 \times 10^2$ Torr at 100 degree C.

In the case of employing such organic source material having lower vapor pressure, the unreacted organic compound 180 having lower vapor pressure can be oxidized by using the oxidizing gas using a method similar to the method for depositing the thin film described in the first embodiment to effectively immobilize the unreacted organic compound. Alternatively, the unreacted organic compound 180 can also be oxynitrized by using a gaseous mixture of the oxidizing gas and the nitriding gas using a method similar to the method for depositing the thin film described in the second embodiment to effectively immobilize the unreacted organic compound.

Therefore, the generation of the particles on the wafer 104 can be inhibited even if the wafer 104 is loaded in the interior of the chamber 1060 and the deposition process of the thin film is conducted. As a result, the semiconductor device having better reliability can be stably manufactured with higher production efficiency.

FOURTH EMBODIMENT

The present embodiment illustrates an example of applying the present invention to a metal oxide semiconductor field effect transistor (MOSFET). MOSFET according to the present embodiment has a structure shown in FIG. 6. The MOSFET (transistor) shown in FIG. 6 comprises, on a silicon substrate 400, a gate electrode, which includes a multilayered body of a gate insulating film composed of a multi-layered body of a silicon oxynitride film 402 and a metal compound film 404, and a gate electrode 406 composed of polysilicon. Side walls 410 composed of a silicon oxide film are formed on side faces of the gate electrode. A source region and a drain region 412 containing an impurity diffused therein are formed on the face of the silicon substrate 400 in both sides of the gate electrode.

The metal compound film 404 has a chemical composition represented by $HfO_xC_yN_z$ (where x, y and z are selected to satisfy $0<x$, $0.1 \leq y \leq 1.25$, $0.01 \leq z$ and $x+y+z=2$). Penetration of an impurity in the gate electrode into the silicon substrate can be effectively inhibited by employing such film.

Preferable source gas for depositing the metal compound deposition may include $Hf(N(C_2H_5)_2)_4$, $Hf(N(CH_3)_2)_4$, $Hf(N(CH_3)(C_2H_5))_4$, $Zr(N(C_2H_5)_2)_4$, $Zr(N(CH_3)_2)_4$, $Zr(N(CH_3)(C_2H_5))_4$ and the like. Penetration of an impurity can be more effectively inhibited by employing such compound.

Figure 7A:
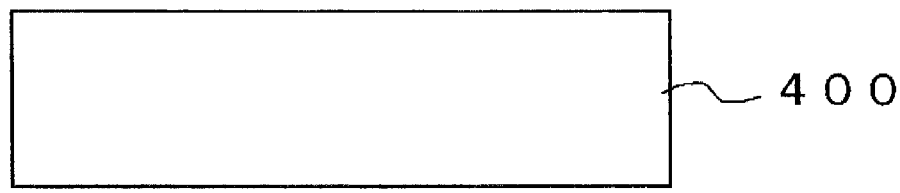
FIGS. 7A to 7D are cross sectional process views of the transistor, for describing a manufacturing process for the transistor according to the embodiment.
Figure 7B:
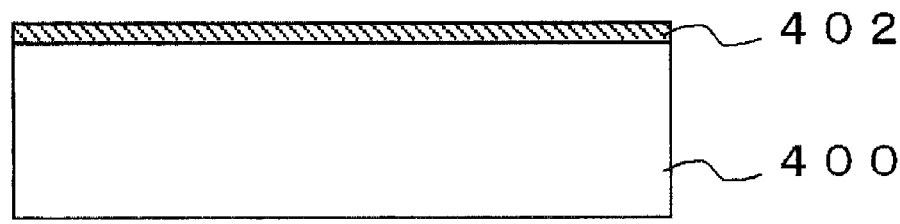
Figure 7C:
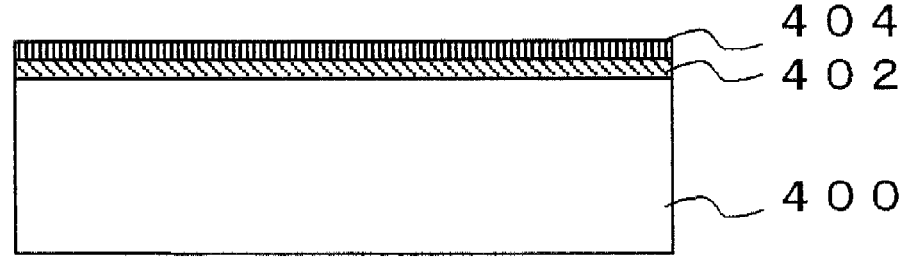

A manufacturing process for the MOSFET shown in FIG. 6 will be described in reference with FIGS. 7A to 7D and FIGS. 8E and 8F. Firstly, as shown in FIG. 7A, a silicon substrate 400 that has been cleaned its surface by using a predetermined liquid chemical solution is prepared. Then, as shown in FIG. 7B, a silicon oxynitride film 402 is formed on a main surface of the silicon substrate 400 using a chemical vapor deposition (CVD) technique. Subsequently, as shown in FIG. 7C, a metal compound film 404 is formed using an atomic layer deposition (ALD) technique. Among the deposition gases employing in this deposition process, a metal compound represented by a general formula of $Hf(NRR')_4$ can be employed for a metal source gas (where R and R' are same or different hydrocarbon group(s), and preferably linear or branched alkyl group). R and R' may preferably be alkyl group having 6 or less carbons/carbon, and more specifically, methyl group, ethyl group, propyl group, tertiary butyl group or the like may be employed.

On the other hand, typical oxidizing gas employed for depositing the metal compound film 404 includes oxygen or a chemical compound containing oxygen. More specifically, the typical compounds may be $NO$, $NO_2$, $N_2O$, $H_2O$, $O_2$, $O_3$ and the like. Among these compounds, $NO$, $NO_2$ and $N_2O$ are preferable, and a gaseous mixture of $NO$ and $NO_2$ and a gaseous mixture of $NO$ and $O_3$, which represent combinations of nitriding gas and oxidizing gas, are more preferable. Stable deposition of the capacitor film having better film quality can be obtained by selecting such compounds. Further, $NO$, $N_2O$ and $NO_2$ are easier to be removed from the deposition apparatus by purging, thereby improving the productive efficiency.

Here, in the deposition process for the metal compound film 404, any one of the methods for depositing the metal compound film described in the first embodiment or the second embodiment is employed.

The supply of the deposition gas is conducted as follows, for example. Firstly, $Hf(N(CH_3)(C_2H_5))_4$ is supplied as a source material in an interior of a chamber 1060 of an ALD apparatus to cause a chemical reaction on a surface of a lower electrode thin film, so that one atomic layer is deposited thereon. Next, the supply of $Hf(N(CH_3)(C_2H_5))_4$ is stopped, and then, an inert gas, typical example of which include $N_2$, Ar or the like, is introduced into the chamber 1060 as a purge gas to purge or flush the excess amount of unreacted $Hf(N(CH_3)(C_2H_5))_4$ out.

Next, NO gas is supplied therein to remove functional group that terminates Hr deposited on the substrate. Subsequently, the supply of NO gas is stopped, and an inert gas, typical example of which include $N_2$, Ar or the like, is introduced therein as a purge gas to purge or flush unreacted NO and/or byproducts generated after reaction, and then the supply of the purge gas is stopped.

As described above, a desired number of the sequential process cycle consisting of the supply of $Hf(N(CH_3)(C_2H_5))_4$, the first purge, the supply of NO and the second purge are repeated to obtain the thin metal compound 404 consisting of $HfO_xC_yN_z$ having a film thickness of 5 to 15 nm (where x, y and z are selected to satisfy $0<x$, $0.1 \leq y \leq 1.25$, $0.01 \leq z$ and $X+y+z=2$).

Figure 7D:
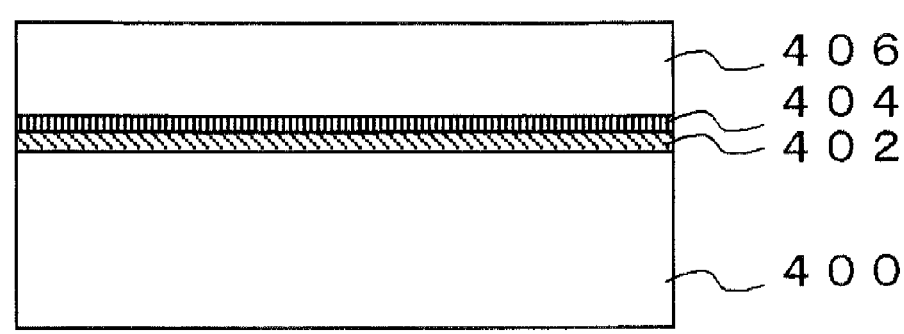

Thereafter, a gate electrode film 406 is formed on the metal compound film 404, as shown in FIG. 7D. It is preferable to employ polycrystalline silicon for the gate electrode film 406, and otherwise, a metal electrode such as SiGe, TiN, WN, Ni and the like can also be employed.

Figure 8E:
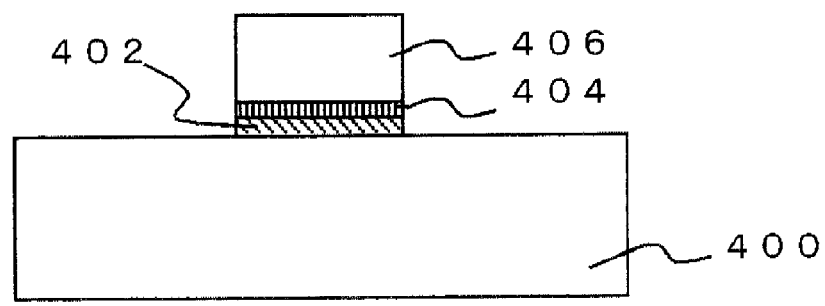
FIGS. 8E and 8F are cross sectional process views of the transistor, for describing a manufacturing process for the transistor according to the embodiment.
Figure 8F:
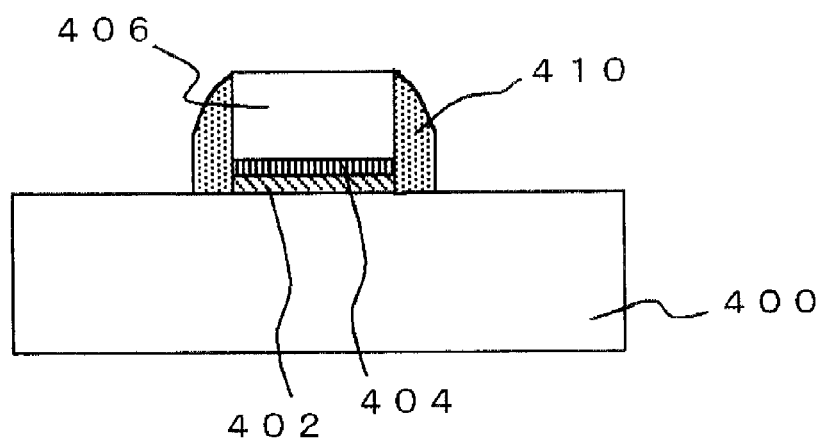

Subsequently, as shown in FIG. 8E, the silicon nitride film 402, the metal compound film 404 and the gate electrode film 406 are etched to form a predetermined shape, thereby obtaining a gate electrode. Thereafter, side walls 410 are formed onto side faces of the gate electrode and an impurity is introduced into the gate electrode and the surface of the silicon substrate 400 in both sides thereof. As described above, the MOSFET shown in FIG. 8F is manufactured.

Since the gate insulating film in the MOSFET according to the present embodiment includes the metal compound film 404 (thin film), which is formed by employing the process for forming the metal compound film described in the first embodiment or the second embodiment, the penetration of an impurity contained in the gate electrode film 406 through the gate insulating film into the silicon substrate 400 can be effectively prevented. Having such configuration, the transistors having higher reliability can be obtained.

FIFTH EMBODIMENT

Figure 9:
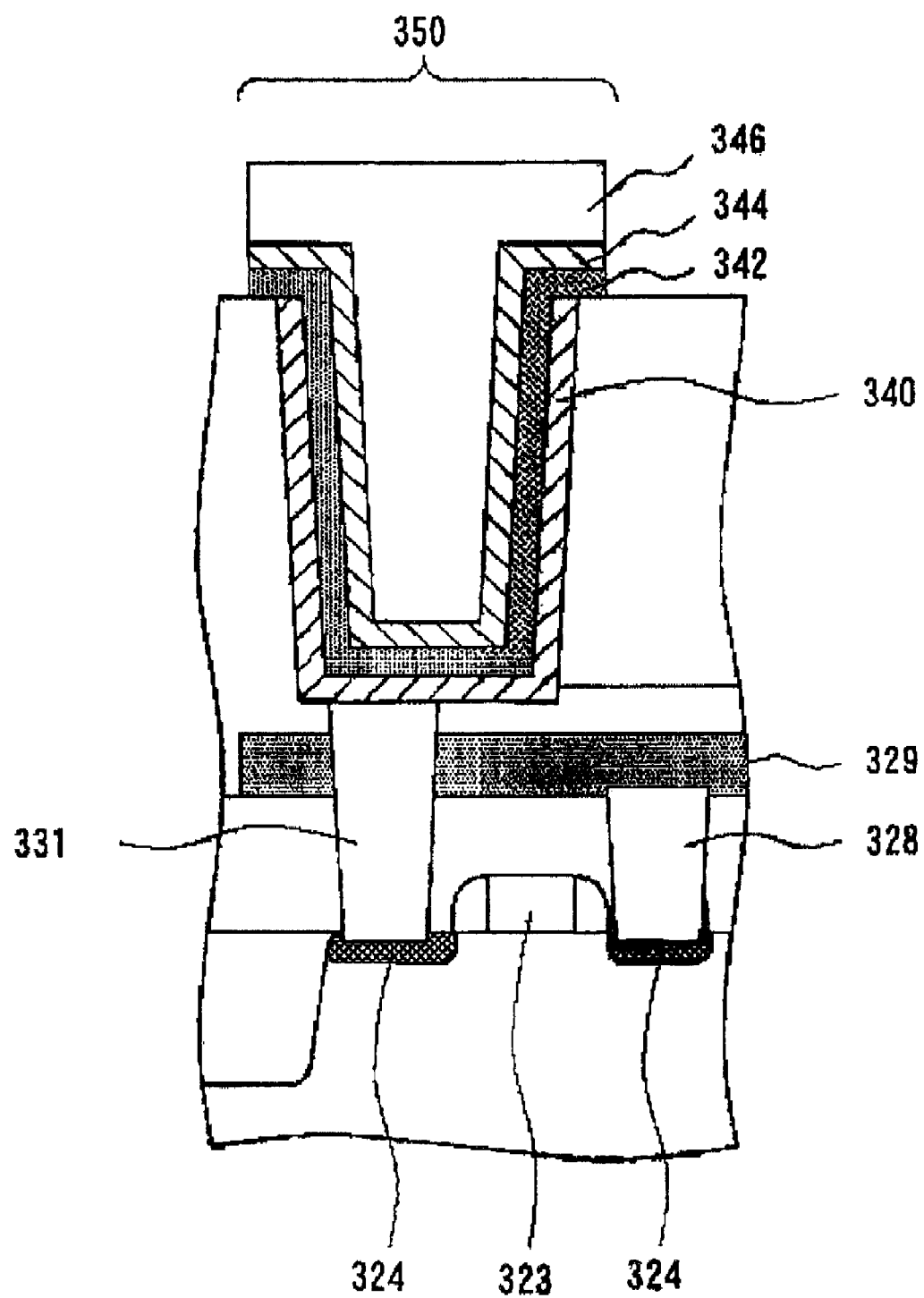
FIG. 9 is a cross sectional process views of the transistor, for describing a manufacturing process for a capacitor according to the embodiment.

The present embodiment relates to a cylinder type metal-insulator-metal (MIM) capacitor device. FIG. 9 is a view showing a schematic structure of a capacitor device according to the present embodiment. A cylinder type MIM capacitor device is provided on a transistor having a gate electrode 323 and a source drain region 324 through a capacitor contact 331.

The capacitor device has a multilayered structure comprising a lower electrode (first electrode) 340, a capacitor film 342, an upper electrode 344 and a tungsten film 346, which are formed in this order and are patterned to a predetermined shape. Further, a bit line 329 is formed on the transistor through a cell contact 328.

Although the bit line 329 and the capacitor contact 331 are illustrated in the same cross-sectional view in FIG. 9, the illustration is made for helping to understand the whole structure thereof, and in reality, these do not intersect. More specifically, the bit line 329 is disposed within a gap in a region where the capacitor contact 331 is provided.

The available deposition source materials for depositing the capacitor film 342 may include $Zr(N(C_2H_5)_2)_4$, $Zr(N(CH_3)_2)_4$, $Zr(N(CH_3)(C_2H_5))_4$, $Hf(N(C_2H_5)_2)_4$, $Hf(N(CH_3)_2)_4$, $Hf(N(CH_3)(C_2H_5))_4$ and the like. Even if such chemical compounds are selected, the unreacted organic compound 180 of such chemical compounds can be immobilized by conducting the above-described processing method after the deposition process to clean the interior of the vapor phase deposition apparatus 100. Thus, contamination of the particles in the film is inhibited even though another wafer then is loaded in the interior of the vapor phase deposition apparatus 100 and the deposition is further conducted. As a result, the capacitor film providing lower leakage current and having better film quality can be obtained.

Typical oxidizing gas employed for depositing the capacitor film 342 includes oxygen or a chemical compound containing oxygen. More specifically, the typical compounds may be $NO$, $NO_2$, $N_2O$, $H_2O$, $O_2$, $O_3$ and the like. Among these compounds, $NO$, $NO_2$ and $N_2O$ are preferable, and a gaseous mixture of NO and $NO_2$ and a gaseous mixture of NO and $O_3$, which represent combinations of nitriding gas and oxidizing gas, are more preferable. The capacitor film having better film quality can be stably deposited by selecting such combination of gases.

In the deposition process for the capacitor film 342 employing the above-described source materials, the method for depositing the metal compound film described in the first embodiment or the second embodiment is employed.

Since the capacitor film 342 contains the metal compound film that is formed by using the method for depositing the metal compound film described in the first embodiment or the second embodiment in the cylinder type MIM device element according to the present embodiment, contamination of the particles in the capacitor film 342 can be effectively inhibited. Therefore, the cylinder type MIM capacitor device having higher reliability can be obtained.

While the embodiments of the present invention have been described above in reference to the annexed figures, it should be understood that the descriptions above are presented for the purpose of illustrating the present invention, and various configurations other than the above-described configurations can also be adopted.

For example, an oxidizing gas containing $Zr(NRR')_4$ or $Hf(NRR')_4$ is employed for the source gas in the above-described embodiment to deposit films containing compounds such as $ZrO_2$ or $HfO_2$ using an ALD technique or a CVD technique. In this occasion, in the interior of the chamber 1060 of the vapor phase deposition apparatus 100, the wafer having the thin film formed thereon is unloaded from the interior of the vapor phase deposition apparatus 100, and the oxidizing gas is introduced in the interior of the chamber 1060 to immobilize the unreacted organic compound 180 during the time when deposition process is not conducted.

In addition, a purge process is typically conducted in the interior of the chamber 1060, when the deposition process is not conducted therein. The unreacted organic compound 180 is immobilized by flowing the oxidizing gas in the purge process. In the case of conducting the purge process by using the inert gas and the oxidizing gas, the purge process may be separated into a purge process by using only the inert gas and a purge process by using only the oxidizing gas.

In addition, while the method for supplying the source material such as TEMAZ into the chamber 1060 in the above-described embodiment employs a downflow system, in which the shower head 108 is provided on the upper portion of the chamber 1060, another configuration, in which the shower head 108 is provided on a side of the chamber 1060, may alternatively be employed. By employing the method for depositing the metal compound film according to the present invention, even if such another configuration is employed, the immobilization of the unreacted organic compound 180 derived from the source gas such as TEMAZ is inhibited. Therefore, the high dielectric constant film having higher quality can be stably obtained.

It is apparent that the present invention is not limited to the above embodiment, that may be modified and changed without departing from the scope and spirit of the invention.

What is claimed is:

1. A method for processing an interior of a vapor phase deposition apparatus, after conducting a deposition of a thin film by utilizing an organic source material including Zr or Hf and an oxidizing gas within said vapor phase deposition apparatus, comprising:
   immobilizing an unreacted organic compound within the interior of said vapor phase deposition apparatus by introducing said oxidizing gas into the interior of said vapor phase deposition apparatus, without opening said vapor phase deposition apparatus to the atmosphere;
   wherein said organic source material is M(NRR'), where the R or R' is hydrocarbon substitute, M is Zr or Hf.

2. The method as claimed in claim 1, said vapor phase deposition is atomic layer deposition.

3. The method as claimed in claim 1, wherein R is methyl group and R' is ethyl group.

4. The method as claimed in claim 1, wherein a process for immobilizing said unreacted organic compound is conducted in every time after a deposition process for a wafer.

5. The method as claimed in claim 1, wherein a process for immobilizing said unreacted organic compound is conducted in every time between lot processing for said films.

6. The method as claimed in claim 1, wherein said oxidizing gas is $O_3$.

7. The method as claimed in claim 6, wherein flow ratio of $O_3$ gas is between 100 to 2000 sccm.

8. The method as claimed in claim 6, wherein concentration of $O_3$ gas is between 50 to 300 $g/Nm^3$.

9. The method as claimed in claim 6, wherein pressure of $O_3$ gas is between 0.05 to 50 torr.

10. The method as claimed in claim 1, wherein duration time of introducing oxidizing gas is longer than the oxidation step in said deposition.

11. The method as claimed in claim 10, wherein said duration time is not shorter than 30 second.

* * * * *